(12) United States Patent
Sasaki

(10) Patent No.: US 10,395,890 B2
(45) Date of Patent: Aug. 27, 2019

(54) ION IMPLANTATION METHOD AND ION IMPLANTATION APPARATUS

(71) Applicant: SUMITOMO HEAVY INDUSTRIES ION TECHNOLOGY CO., LTD., Tokyo (JP)

(72) Inventor: Haruka Sasaki, Ehime (JP)

(73) Assignee: SUMITOMO HEAVY INDUSTRIES ION TECHNOLOGY CO., LTD., Tokyo (JP)

(*) Notice: Subject to any disclaimer, the term of this patent is extended or adjusted under 35 U.S.C. 154(b) by 49 days.

(21) Appl. No.: 15/862,335

(22) Filed: Jan. 4, 2018

(65) Prior Publication Data

US 2018/0197716 A1  Jul. 12, 2018

(30) Foreign Application Priority Data

Jan. 6, 2017 (JP) .................... 2017-000903

(51) Int. Cl.
| | |
|---|---|
| H01J 37/317 | (2006.01) |
| H05H 15/00 | (2006.01) |
| H01J 37/05 | (2006.01) |
| H05H 7/00 | (2006.01) |
| H05H 9/04 | (2006.01) |

(52) U.S. Cl.
CPC .......... *H01J 37/3171* (2013.01); *H01J 37/05* (2013.01); *H05H 7/001* (2013.01); *H05H 9/041* (2013.01); *H05H 15/00* (2013.01); *H05H 2277/12* (2013.01)

(58) Field of Classification Search
CPC .... H01J 37/30; H01J 37/3002; H01J 37/3171; H01J 37/3172

USPC ................... 250/492.1, 492.2, 492.21, 492.3
See application file for complete search history.

(56) References Cited

U.S. PATENT DOCUMENTS

| | | | |
|---|---|---|---|
| 5,440,203 A | 8/1995 | Nakanishi | |
| 5,451,847 A | 9/1995 | Nakanishi | |
| 2004/0097058 A1* | 5/2004 | Purser | H01J 37/14 438/514 |

(Continued)

FOREIGN PATENT DOCUMENTS

| | | |
|---|---|---|
| JP | S58-012249 A | 1/1983 |
| JP | H05-159899 A | 6/1993 |

(Continued)

*Primary Examiner* — Jason L McCormack
(74) *Attorney, Agent, or Firm* — Michael Best & Friedrich LLP

(57) ABSTRACT

An ion implantation apparatus includes: a multistage linear acceleration unit including a plurality of stages of high-frequency resonators and a plurality of stages of focusing lenses; a first beam measuring unit disposed in the middle of the multistage linear acceleration unit and configured to allow passage of a beam portion adjacent to a center of a beam trajectory and measure a current intensity of another beam portion blocked by an electrode body outside a vicinity of the center of the beam trajectory; a second beam measuring unit disposed downstream of the multistage linear acceleration unit and configured to measure a current intensity of an ion beam exiting from the multistage linear acceleration unit; and a control device configured to adjust a control parameter of the plurality of stages of focusing lenses based on measurement results of the first and second beam measuring units.

22 Claims, 12 Drawing Sheets

(56) References Cited

U.S. PATENT DOCUMENTS

| | | | |
|---|---|---|---|
| 2008/0073553 A1* | 3/2008 | Blake | H01J 37/244 250/398 |
| 2014/0150723 A1* | 6/2014 | Kabasawa | H01J 37/32412 118/723 R |
| 2014/0239200 A1* | 8/2014 | Miyamoto | H01J 37/304 250/492.3 |

FOREIGN PATENT DOCUMENTS

| JP | H07-211500 A | 8/1995 |
|---|---|---|
| JP | 2002-270129 A | 9/2002 |
| JP | 2004-259590 A | 9/2004 |

\* cited by examiner 166
164

FIG. 11
|  | FIRST CURRENT INTENSITY I1 | SECOND CURRENT INTENSITY I2 | CURRENT RATIO I2/I1 |
|---|---|---|---|
| BEFORE ADJUSTMENT (FIG. 7) | LARGE | SMALL | SMALL |
| DURING ADJUSTMENT (FIG. 8) | MEDIUM | MEDIUM | MEDIUM |
| AFTER ADJUSTMENT (FIG. 9) | SMALL | LARGE | LARGE |
| INAPPROPRIATE (FIG. 10) | SMALL | SMALL | MEDIUM |
FIG. 12A
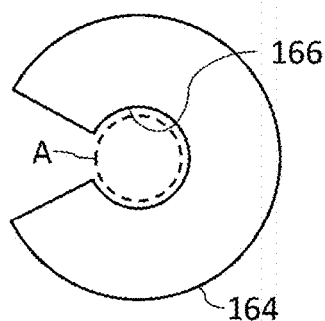
FIG. 12B
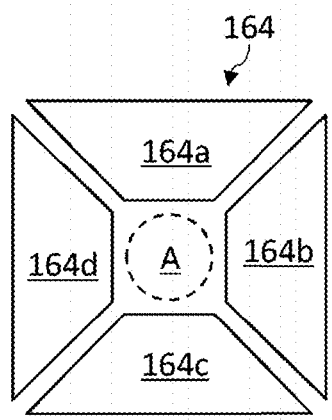

ION IMPLANTATION METHOD AND ION IMPLANTATION APPARATUS

RELATED APPLICATIONS

Priority is claimed to Japanese Patent Application No. 2017-000903, filed Jan. 6, 2017, the entire content of which is incorporated herein by reference.

BACKGROUND

Technical Field

A certain embodiment of the present invention relates to an ion implantation method and an ion implantation apparatus.

Description of Related Art

In an ion implantation apparatus that can generate an ion beam having a high energy (for example, greater than or equal to 1 MeV), the ion beam is accelerated by using a multistage high-frequency linear accelerator (LINAC). In the high-frequency linear accelerator, high-frequency parameters such as a voltage amplitude, a frequency, and a phase of each stage are optimized such that a desired energy is acquired. A focusing and defocusing lens for adjusting the profile of the transferred beam is disposed between each stage of high-frequency resonators. A parameter of the focusing and defocusing lens is also optimized.

SUMMARY

According to an aspect of the present invention, there is provided an ion implantation apparatus including a multistage linear acceleration unit that includes a plurality of stages of high-frequency resonators disposed along a beam trajectory in design and configured to accelerate an ion beam transferred along the beam trajectory, and a plurality of stages of focusing lenses, each of which is disposed between each stage of the high-frequency resonators and is configured to cause the ion beam to converge in at least one of an x direction and a y direction orthogonal with respect to the beam trajectory to adjust a beam profile of the transferred ion beam in a plan view orthogonal with respect to the beam trajectory; a first beam measuring unit that is disposed in the middle of the multistage linear acceleration unit, includes an electrode body disposed away from at least a vicinity of a center of the beam trajectory in the plan view orthogonal with respect to the beam trajectory, and is configured to allow passage of a beam portion adjacent to the center of the beam trajectory and measure a current intensity of another beam portion blocked by the electrode body outside the vicinity of the center of the beam trajectory; a second beam measuring unit that is disposed downstream of the multistage linear acceleration unit and is configured to measure a current intensity of the ion beam exiting from the multistage linear acceleration unit; and a control device configured to adjust a control parameter of the plurality of stages of focusing lenses based on measurement results of the first beam measuring unit and the second beam measuring unit such that the current intensity of the beam exiting from the multistage linear acceleration unit is equivalent to a target value.

According to another aspect of the present invention, there is provided an ion implantation method. The method is an ion implantation method using an ion implantation apparatus. The ion implantation apparatus includes a multistage linear acceleration unit that includes a plurality of stages of high-frequency resonators disposed along a beam trajectory in design and configured to accelerate an ion beam transferred along the beam trajectory, and a plurality of stages of focusing lenses, each of which is disposed between each stage of the high-frequency resonators and is configured to cause the ion beam to converge in at least one of an x direction and a y direction orthogonal with respect to the beam trajectory to adjust a beam profile of the transferred ion beam in a plan view orthogonal with respect to the beam trajectory; a first beam measuring unit that is disposed in the middle of the multistage linear acceleration unit, includes an electrode body disposed away from at least a vicinity of a center of the beam trajectory in the plan view orthogonal with respect to the beam trajectory, and is configured to allow passage of a beam portion adjacent to the center of the beam trajectory and measure a current intensity of another beam portion blocked by the electrode body outside the vicinity of the center of the beam trajectory; a second beam measuring unit that is disposed downstream of the multistage linear acceleration unit and is configured to measure a current intensity of the ion beam exiting from the multistage linear acceleration unit; and a control device configured to adjust a control parameter of the plurality of stages of focusing lenses based on measurement results of the first beam measuring unit and the second beam measuring unit such that the current intensity of the beam exiting from the multistage linear acceleration unit is equivalent to a target value. The ion implantation method includes adjusting the control parameter of the plurality of stages of focusing lenses such that the current intensity measured by the first beam measuring unit is reduced, and that the current intensity measured by the second beam measuring unit is increased; and implanting ions into a wafer by using the ion beam exiting from the multistage linear acceleration unit that operates based on the adjusted control parameter.

BRIEF DESCRIPTION OF THE DRAWINGS

FIG. 11 is a table showing a current intensity that seem to be measured when adjusting a lens parameter.

FIG. 12A and FIG. 12B are plan views schematically illustrating structures of electrode bodies according to modified examples.

DETAILED DESCRIPTION

A focusing and defocusing lens affects the transfer efficiency of a beam, the accuracy of the beam energy, the accuracy of an implantation angle, contamination or particle generation caused by a beam component deviating from a beam trajectory, and the like. Thus, the focusing and defocusing lens is required to be adjusted with high accuracy. In recent years, an increase in the energy of an implanted ion beam is required, and the number of stages of a high-frequency linear accelerator needs to be increased. In this case, the number of stages of focusing and defocusing lenses disposed between each stage of high-frequency resonators is also increased. Thus, when a lens parameter is to be adjusted with high accuracy, a significant amount of period is taken in optimization.

It is desirable to provide a technology that promptly adjusts a lens parameter of a linear accelerator with high accuracy.

Any combination of constituent elements, or substitution of the constituent elements or expressions of the present invention with each other among a method, an apparatus, a system, and the like is also effective as an embodiment of the present invention.

According to the present invention, a lens parameter of a linear accelerator can be promptly adjusted with high accuracy.

Hereinafter, an embodiment of the present invention will be described in detail with reference to the drawings. The same elements in description of the drawings will be designated by the same reference signs and may not be described repeatedly. Configurations described below are for illustrative purposes. The scope of the present invention is not limited by the configurations.

Figure 1:
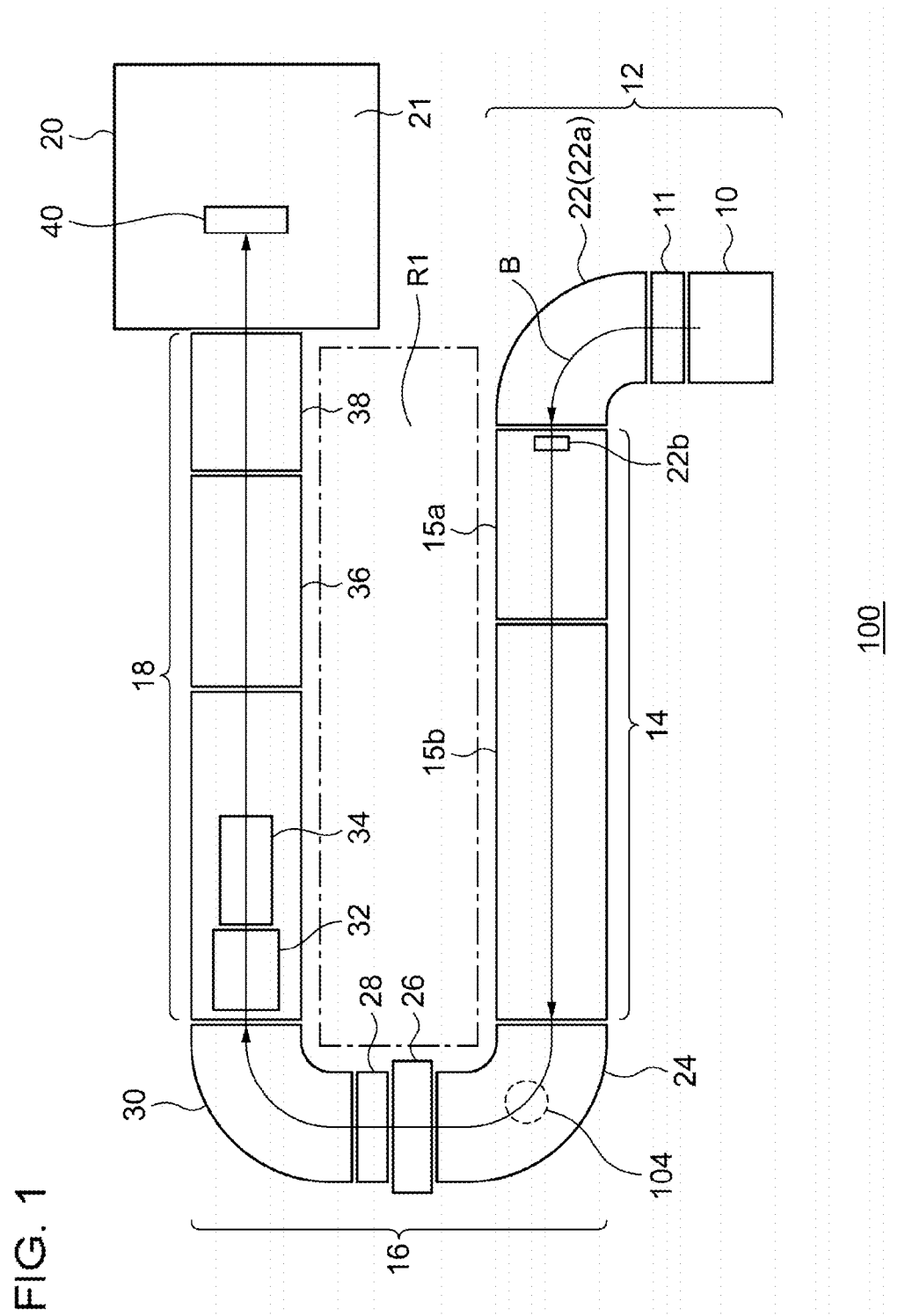
FIG. 1 is a top view schematically illustrating an ion implantation apparatus according to an embodiment.

FIG. 1 is a top view schematically illustrating an ion implantation apparatus 100 according to an embodiment. The ion implantation apparatus 100 is a so-called high energy ion implantation apparatus. The high energy ion implantation apparatus is an ion implantation apparatus that has a high-frequency linear acceleration unit as an ion accelerator and a high energy ion transfer beamline. The high energy ion implantation apparatus accelerates ions generated in an ion source 10 and transfers an ion beam B acquired by the acceleration of ions to a processed object (for example, a substrate or wafer 40) along the beamline, thereby implanting the ions into the processed object.

FIG. 1 illustrates a layout of constituent elements of a beamline unit of the ion implantation apparatus 100. The beamline unit of the ion implantation apparatus 100 includes the ion source 10 and a process chamber 21 for performing an ion implantation process on the processed object. The beamline unit is configured to transfer the ion beam B from the ion source 10 toward the processed object.

As illustrated in FIG. 1, the high energy ion implantation apparatus 100 includes an ion beam generation unit 12, a high energy multistage linear acceleration unit 14, a beam deflection unit 16, a beam transfer line unit 18, and a substrate processing and supply unit 20. The ion beam generation unit 12 generates ions and separates the ions based on their mass. The high energy multistage linear acceleration unit 14 accelerates an ion beam to acquire a high energy ion beam. The beam deflection unit 16 analyzes the energy of the high energy ion beam, corrects a reference trajectory, and controls energy dispersion. The beam transfer line unit 18 transfers the analyzed high energy ion beam to the wafer 40. The substrate processing and supply unit 20 causes the transferred high energy ion beam to be uniformly implanted into a semiconductor wafer.

The ion beam generation unit 12 has the ion source 10, an extraction electrode 11, and a mass analyzer 22. In the ion beam generation unit 12, an ion beam is extracted and accelerated from the ion source 10 through the extraction electrode 11, and the mass of the extracted and accelerated ions are analyzed by the mass analyzer 22. The mass analyzer 22 has a mass analyzing magnet 22a and a mass resolving aperture 22b. While the mass resolving aperture 22b may be disposed immediately downstream of the mass analyzing magnet 22a in another embodiment, the mass resolving aperture 22b in the embodiment is disposed inside an entrance portion of the high energy multistage linear acceleration unit 14 that is a configuration subsequent to the mass analyzing magnet 22a. As a result of the mass analysis by the mass analyzer 22, ion species that are required for implantation are selected, and the ion beam consisting of the selected ion species is guided to the high energy multistage linear acceleration unit 14.

Figure 2:
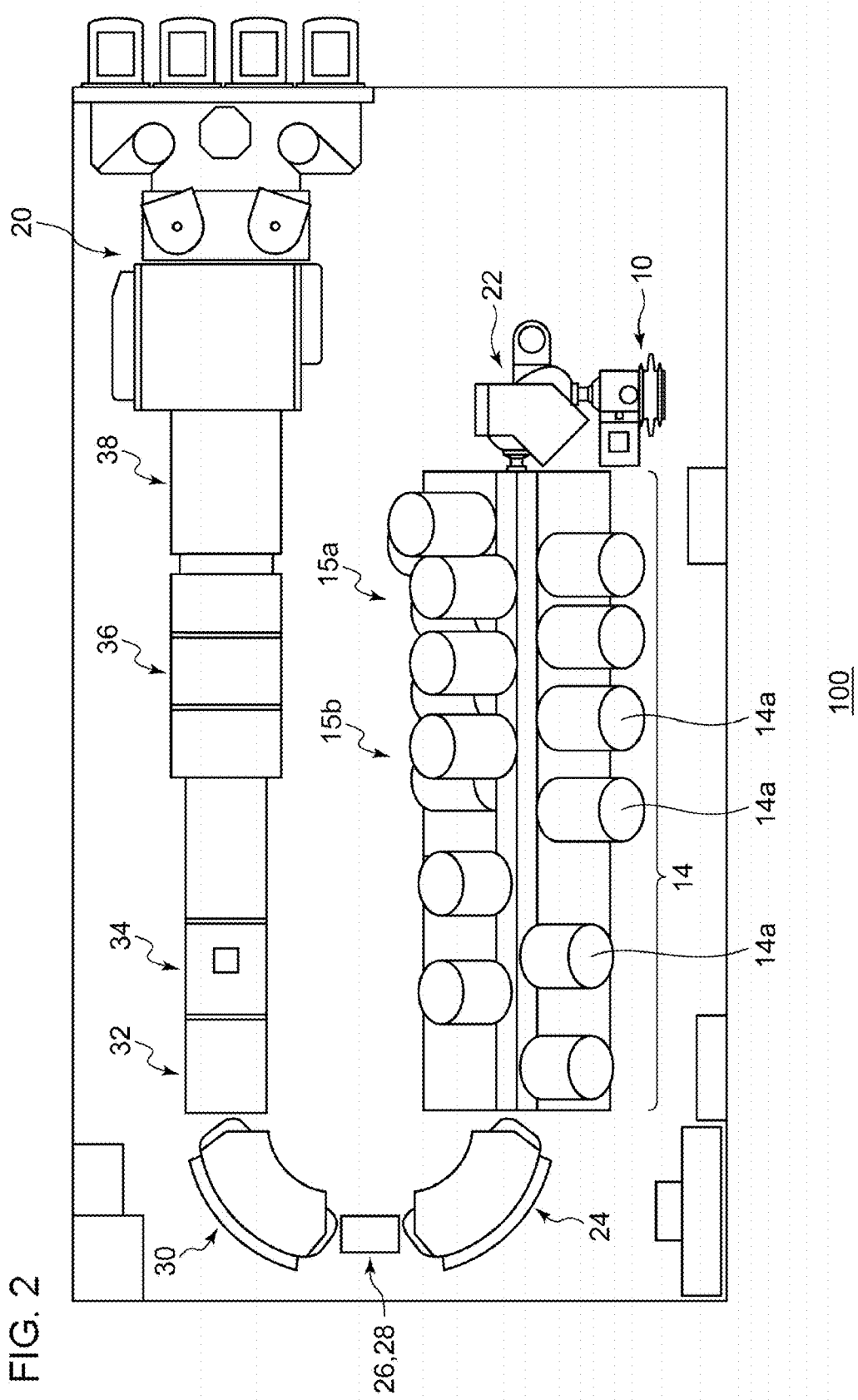
FIG. 2 is a plan view illustrating an overall layout including a schematic configuration of a high energy multistage linear acceleration unit illustrated in FIG. 1.

FIG. 2 is a plan view illustrating an overall layout including a schematic configuration of the high energy multistage linear acceleration unit 14. The high energy multistage linear acceleration unit 14 is a plurality of linear acceleration units accelerating the ion beam, that includes a plurality of acceleration gaps between which one or more high-frequency resonators are interposed. The high energy multistage linear acceleration unit 14 can accelerate ions by using an effect of a high-frequency (RF) electric field.

The high energy multistage linear acceleration unit 14 includes a first linear accelerator 15a that includes a plurality of stages of high-frequency resonators 14a for high energy ion implantation. The high energy multistage linear acceleration unit 14 may include a second linear accelerator 15b that includes an additional plurality of stages of high-frequency resonators 14a for ultra high energy ion implantation. The direction of the ion beam accelerated by the high energy multistage linear acceleration unit 14 is changed by the beam deflection unit 16.

In an ion implantation apparatus that uses high-frequency (RF) acceleration, an amplitude V [kV] and a frequency f [Hz] of a voltage should be considered as high-frequency parameters. When high-frequency acceleration is performed in a plurality of stages, a phase $\varphi$ [deg] of each high frequency is added as a parameter. In addition, a magnetic field lens (for example, a quadrupole electromagnet) or an electric field lens (for example, an electric field quadrupole electrode) is required for controlling cross-sectional size of the ion beam in vertical and horizontal directions by a focusing or defocusing effect in the middle of acceleration or after acceleration. An optimal value of an operating parameter of the magnetic field lens or the electric field lens is changed in accordance with the energy of the ions when passing through the magnetic field lens or the electric field lens. In addition, an intensity of an acceleration electric field affects focusing or defocusing. Thus, the value of the operating parameter is determined after the high-frequency parameter is determined.

Figure 3:
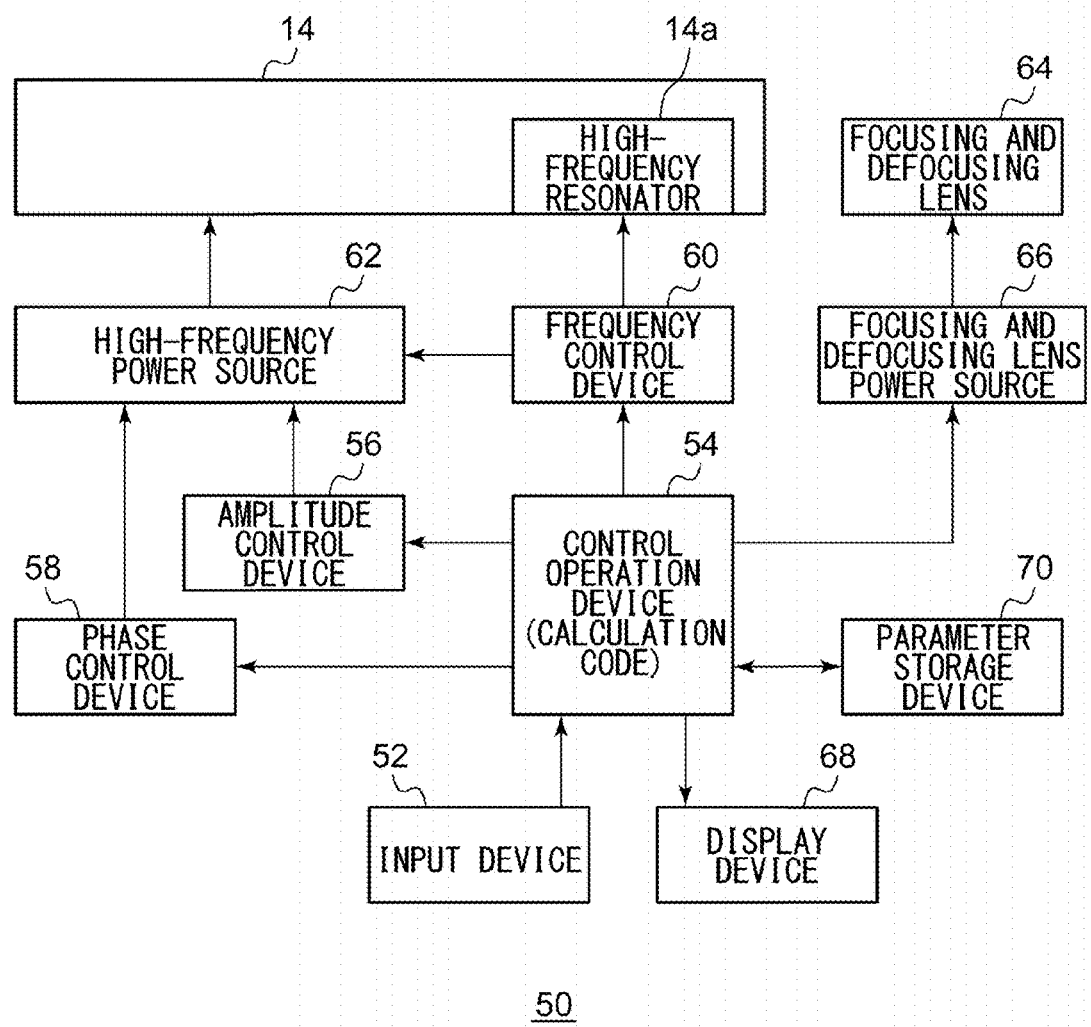
FIG. 3 is a block diagram for describing functions and configurations of a control unit of the high energy multistage linear acceleration unit illustrated in FIG. 1.

FIG. 3 is a block diagram illustrating a configuration of a control unit 50 for a focusing and defocusing lens and the high energy multistage linear acceleration unit 14 in which acceleration electric fields (gaps) at the front ends of the plurality of high-frequency resonators are linearly arranged.

The high energy multistage linear acceleration unit 14 includes one or more high-frequency resonators 14a. Constituent elements required for controlling the high energy multistage linear acceleration unit 14 includes an input device 52, a control operation device 54, an amplitude control device 56, a phase control device 58, a frequency control device 60, a high-frequency power source 62, a focusing and defocusing lens power source 66 for a focusing and defocusing lens 64, a display device 68, and a storage device 70. The input device 52 is where an operator inputs a necessary condition. The control operation device 54 calculates the numerical values of various parameters from the input condition and controls each constituent element. The amplitude control device 56 adjusts the voltage amplitude of the high frequency. The phase control device 58 adjusts the phase of the high frequency. The frequency control device 60 controls the frequency of the high frequency. The display device 68 displays the operating parameter. The storage device 70 stores the determined parameter. The control operation device 54 incorporates a numerical calculation code (program) for calculating the numerical values of various parameters in advance.

In the control operation device 54 of the high-frequency linear accelerator, the incorporated numerical calculation code simulates acceleration and focusing or defocusing of the ion beam based on the input condition, and calculates the high-frequency parameter (the voltage amplitude, the frequency, and the phase) such that the optimal transfer efficiency is acquired. In addition, a parameter (a Q coil current or a Q electrode voltage) of the focusing and defocusing lens 64 for efficiently transferring the ion beam is calculated. The various calculated parameters are displayed on the display device 68. For an acceleration condition that exceeds the capability of the high energy multistage linear acceleration unit 14, an indication meaning that a solution is not found is displayed on the display device 68.

The voltage amplitude parameter is sent from the control operation device 54 to the amplitude control device 56, and the amplitude control device 56 adjusts the amplitude of the high-frequency power source 62. The phase parameter is sent to the phase control device 58, and the phase control device 58 adjusts the phase of the high-frequency power source 62. The frequency parameter is sent to the frequency control device 60. The frequency control device 60 controls the output frequency of the high-frequency power source 62 and controls a resonant frequency of each high-frequency resonator 14a of the high energy multistage linear acceleration unit 14. The control operation device 54 also controls the focusing and defocusing lens power source 66 by using the calculated focusing and defocusing lens parameter.

A necessary number of focusing and defocusing lenses 64 for efficiently transferring the ion beam are disposed inside and/or upstream and downstream of the high-frequency linear accelerator. That is, a defocusing lens and a focusing lens are alternately provided upstream and downstream of the acceleration gap at the front end of each of the plurality of stages of high-frequency resonators 14a. An additional vertical focusing lens is disposed after a horizontal focusing lens at the rear end of the second linear accelerator 15b in order to adjust focusing and defocusing of the high energy accelerated ion beam passing through the high energy multistage linear acceleration unit 14, thereby causing the ion beam having an optimal two-dimensional beam profile to be incident into the beam deflection unit 16 in the downstream stage.

As illustrated in FIG. 1, the beam deflection unit 16 has an energy analyzing electromagnet 24, a horizontal focusing quadrupole lens 26 reducing energy dispersion, an energy resolving aperture 28, and a deflection electromagnet 30 providing beam steering (trajectory correction). The energy analyzing electromagnet 24 bay be referred to as an energy filter electromagnet (EFM). The direction of the high energy ion beam is changed toward the wafer 40 by the beam deflection unit 16.

The beam transfer line unit 18 transfers an ion beam B exiting from the beam deflection unit 16 and has a beam shaper 32, a beam scanner 34, a beam parallelizer 36, and a final energy filter 38 (which includes a final energy separating slit). The beam shaper 32 is configured with a focusing/defocusing lens group. A length of the beam transfer line unit 18 is designed in accordance with a length of the ion beam generation unit 12 and the high energy multistage linear acceleration unit 14. The beam transfer line unit 18 and the high energy multistage linear acceleration unit 14 are connected to the beam deflection unit 16 and forms a U-shaped layout as a whole.

The substrate processing and supply unit 20 is disposed at a rear end of downstream side of the beam transfer line unit 18. The process chamber 21 accommodates a beam monitor, an charge controlling device, a wafer transport mechanism, an electrostatic chuck (ESC), and a wafer scan mechanism. The beam monitor measures the beam current, a position, an implantation angle, a convergent and divergent angle, an ion distribution in vertical and horizontal directions, and the like of the ion beam B. The charge controlling device prevents the wafer 40 from being charged by the ion beam B. The wafer transport mechanism transports the wafer 40 in and out and places the wafer 40 at an appropriate position and an appropriate angle. The ESC holds the wafer 40 during ion implantation. The wafer scan mechanism moves the wafer 40 in a direction perpendicular to a beam scan direction at a speed corresponding to a change in the beam current during implantation.

The beamline unit of the ion implantation apparatus 100 is configured as a horizontal U-shaped folded beamline having two long linear portions facing each other. The long linear portion disposed upstream is configured with a plurality of units that accelerate the ion beam B generated in the ion source 10. The long linear portion disposed downstream is configured with a plurality of units that implant the ion beam B into the wafer 40 after adjusting the ion beam B of which the direction is changed with respect to the long linear portion disposed upstream. The two long linear portions are configured to have approximately the same length. A work space R1 having a sufficient area for maintenance work is provided between the two long linear portions.

The high energy ion implantation apparatus 100 in which each unit is disposed in a U shape has reduced its foot print and provides favorable workability. In the high energy ion implantation apparatus 100, each unit or each device can be mounted or demounted in accordance with a beamline reference position by configuring each unit or each device as a module.

The high energy multistage linear acceleration unit 14 and the beam transfer line unit 18 are disposed in a folded shape.

Thus, the total length of the high energy ion implantation apparatus 100 can be reduced. The high energy multistage linear acceleration unit 14 and the beam transfer line unit 18 are disposed in an approximately linear shape in an apparatus in the related art. A curvature radius of curvature a plurality of deflection electromagnets constituting the beam deflection unit 16 is optimized such that the width of the apparatus is minimized. Accordingly, the foot print of the apparatus is minimized, and work operation can be performed for each device of the high energy multistage linear acceleration unit 14 or the beam transfer line unit 18 in the work space R1 interposed between the high energy multistage linear acceleration unit 14 and the beam transfer line unit 18. In addition, movement of a worker is reduced since the ion source 10 having a comparatively short maintenance interval is disposed adjacent to the substrate processing and supply unit 20 in which loading/unloading of a substrate is required.

Figure 4:
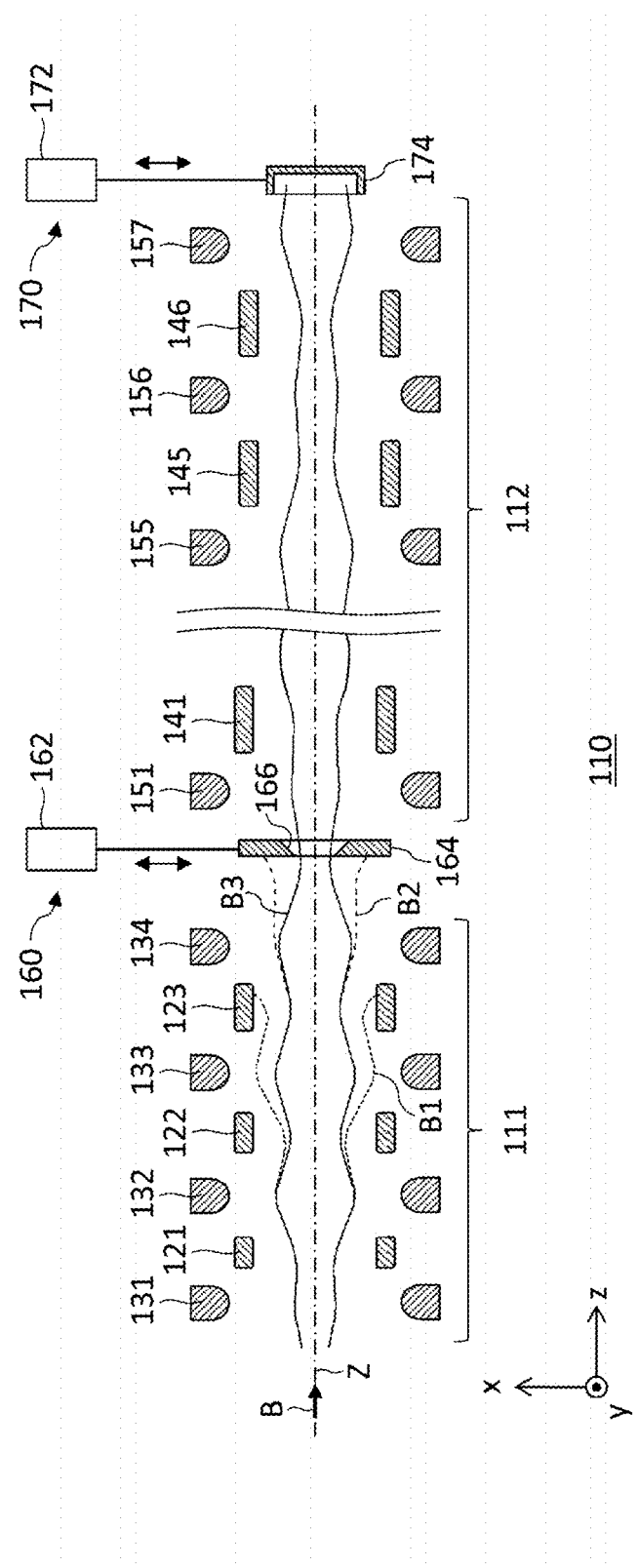
FIG. 4 is a sectional view illustrating a schematic configuration of a multistage linear acceleration unit according to the embodiment.

FIG. 4 is a sectional view illustrating a schematic configuration of a multistage linear acceleration unit 110 according to the embodiment. The multistage linear acceleration unit 110 corresponds to the high energy multistage linear acceleration unit 14 described above. The multistage linear acceleration unit 110 includes a first linear accelerator 111 and a second linear accelerator 112. A first beam measuring unit 160 and a second beam measuring unit 170 are disposed in the multistage linear acceleration unit 110.

The first linear accelerator 111 is an acceleration unit disposed on the upstream side and corresponds to the first linear accelerator 15a described above. The first linear accelerator 111 has a plurality of stages of high-frequency electrodes 121 to 123 and a plurality of stages of lens electrodes 131 to 134 disposed along a beam trajectory Z. Each of the plurality of stages of high-frequency electrodes 121 to 123 is a cylinder-shaped electrode body. The high frequency resonators 14a are respectively connected to the plurality of stages of high-frequency electrodes 121 to 123. Each of the plurality of stages of lens electrodes 131 to 134 is an electric field quadrupole electrode. The lens electrodes 131 to 134 are disposed to face each other in an x direction and a y direction around the beam trajectory (z direction). Each of the plurality of stages of lens electrodes 131 to 134 functions as a horizontal focusing (vertical defocusing) lens that focuses a beam in the x direction, or a vertical focusing (horizontal defocusing) lens that focuses a beam in the y direction.

In the first linear accelerator 111, the plurality of stages of high-frequency electrodes 121 to 123 and the plurality of stages of lens electrodes 131 to 134 are alternately disposed along the beam trajectory Z. The lens electrode 131 is disposed at the entrance of the first linear accelerator 111 into which the ion beam B of an acceleration target is incident. The lens electrode 134 is disposed at the exit of the first linear accelerator 111. Each stage of the high-frequency electrodes 121, 122, and 123 is disposed between adjacent lens electrodes. In the illustrated example, three stages of high-frequency electrodes 121 to 123 are disposed, and four stages of lens electrodes 131 to 134 are disposed. The number of stages of high-frequency electrodes and lens electrodes is not limited and may be different from the illustrated example in a modified example.

The second linear accelerator 112 is disposed on the downstream side of the first linear accelerator 111, and has a plurality of stages of high-frequency electrodes 141 to 146 and a plurality of stages of lens electrodes 151 to 157 disposed along the beam trajectory Z. While the second linear accelerator 112 is configured in the same manner as the first linear accelerator 111, the length of each high-frequency electrode of the second linear accelerator 112 along the beam trajectory Z is longer than that of the first linear accelerator 111 so that a relatively high energy beam can be efficiently accelerated on the downstream side. The second linear accelerator 112 has more stages of high-frequency electrodes than the first linear accelerator 111. In the illustrated example, six stages of high-frequency electrodes 141 to 146 are disposed, and seven stages of lens electrodes 151 to 157 are disposed. The number of stages of high-frequency electrodes and lens electrodes is not limited and may be different from the illustrated example in a modified example.

The first beam measuring unit 160 is disposed between the first linear accelerator 111 and the second linear accelerator 112, and measures a beam exiting from the first linear accelerator 111. The first beam measuring unit 160 has an electrode body 164 and a first drive mechanism 162. The electrode body 164 detects the beam. The first drive mechanism 162 moves the electrode body 164. An opening 166 is provided in the vicinity of the center of the electrode body 164, and the vicinity of the center of the electrode body 164 is deficient. The electrode body 164 is configured to allow passage of a beam portion adjacent to the center of the beam trajectory Z and block another beam portion outside the vicinity of the center of the beam trajectory z in a plan view orthogonal to the beam trajectory Z (that is, a xy plan view).

The first drive mechanism 162 is configured to enable the electrode body 164 to move between a state in which the electrode body 164 is disposed in an insert position on the beam trajectory Z, and a state in which the electrode body 164 is disposed in a retraction position away from the beam trajectory Z. In the case of disposing the electrode body 164 in the insert position, the first drive mechanism 162 disposes the electrode body 164 such that the center of the opening 166 of the electrode body 164 corresponds with the center of the beam trajectory Z. Accordingly, in the insert position, the beam portion adjacent to the center of the beam trajectory passes through the opening 166, and the other beam portion outside the vicinity of the center of the beam trajectory is blocked by the electrode body 164. FIG. 4 illustrates the electrode body 164 disposed in the insert position. In the case of disposing the electrode body 164 in the retraction position, the first drive mechanism 162 causes the electrode body 164 to retract to a position in which the entirety of the transferred ion beam is not blocked by the electrode body 164. For example, the electrode body 164 retracts to the position of the high-frequency electrodes or lens electrodes in a direction away from the beam trajectory Z (the x direction or the y direction).

The second beam measuring unit 170 is disposed downstream of the multistage linear acceleration unit 110, and measures abeam exiting from the second linear accelerator 112. The second beam measuring unit 170 has a Faraday cup 174 and a second drive mechanism 172 that moves the Faraday cup 174. The Faraday cup 174 is configured to detect the entirety of the ion beam exiting from the second linear accelerator 112. This is contrastive to the electrode body 164 in which the opening 166 is formed at the center. In a case where the electrode body 164 on the upstream side is in the insert position, the Faraday cup 174 detects the beam portion passing through the opening 166 of the electrode body 164.

The second drive mechanism 172 moves the Faraday cup 174 between an insert state in which the Faraday cup 174 is disposed on the beam trajectory Z, and a retraction state in which the Faraday cup 174 is disposed in a position away from the beam trajectory Z. The second drive mechanism 172 inserts the Faraday cup 174 when adjusting the parameter of the multistage linear acceleration unit 110 so that the current intensity of the ion beam exiting from the multistage linear acceleration unit 110 can be measured. The second drive mechanism 172 causes the Faraday cup 174 to retract when executing the ion implantation process so that the ion beam is transferred downstream of the multistage linear acceleration unit 110.

Figure 5A:
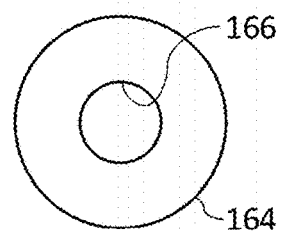
FIG. 5A to FIG. 5F are plan views schematically illustrating a structure of an electrode body.
Figure 5B:
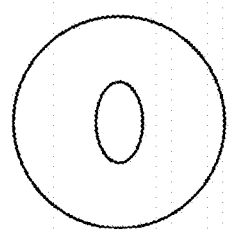
Figure 5C:
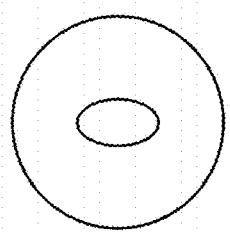
Figure 5D:
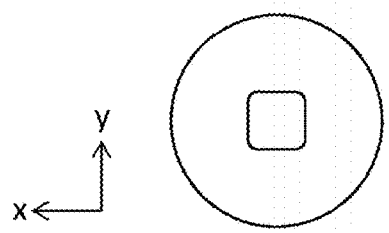
Figure 5E:
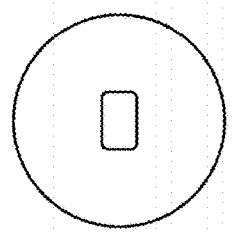
Figure 5F:
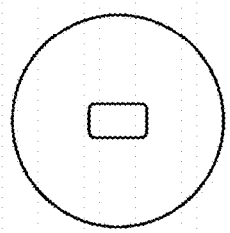

FIG. 5A to FIG. 5F are plan views schematically illustrating the structure of the electrode body 164, and illustrate the electrode body 164 seen in the xy plane orthogonal t to the beam trajectory Z. As illustrated, the electrode body 164 has a circular shape in which the opening 166 is disposed in the vicinity of the center thereof. For example, the electrode body 164 has the opening 166 having a circular shape with the same dimensions in the x direction and the y direction as illustrated in FIG. 5A. The electrode body 164 may have the opening 166 having an elliptical shape with different dimensions in the x direction and the y direction as illustrated in FIG. 5B or FIG. 5C. The electrode body 164 may have the opening 166 with a rectangular shape or an approximately rectangular shape with four rounded corners as illustrated in FIGS. 5D to 5F.

The shape of the opening 166 of the electrode body 164 is determined in accordance with an ideal beam profile in design of the ion beam in the position of the electrode body 164. The "ideal beam profile" is an ideal beam profile that is acquired in the case of transferring the ion beam such that the transfer efficiency is maximized. The shape of the ideal beam profile can be acquired by, for example, electromagnetically simulating a transfer state in the multistage linear acceleration unit 110. For example, in a case where the ideal beam profile relatively horizontally converges (vertically diverges) in the position of the electrode body 164, the shape of the opening 166 is determined such that the dimension thereof in the y direction is greater than the dimension thereof in the x direction. In a case where the ideal beam profile relatively vertically converges (horizontally diverges) in the position of the electrode body 164, the shape of the opening 166 is determined such that the dimension thereof in the y direction is smaller than the dimension thereof in the x direction. If the ideal beam profile is similar to a circular shape in the position of the electrode body 164, the shape of the opening 166 is determined such that the dimensions thereof in the x direction and the y direction are equivalent.

The shape of the opening 166 of the electrode body 164 is determined such that the dimension thereof is the same as the dimension of the ideal beam profile or slightly smaller than the dimension of the ideal beam profile in the position of the electrode body 164. For example, the shape of the opening 166 of the electrode body 164 is determined such that the dimension thereof is 80%, 85%, 90%, 95%, or 100% of the dimension of the ideal beam profile. The shape of the opening 166 of the electrode body 164 may have a slightly greater dimension than that of the ideal beam profile. For example, the size of the opening 166 may be 105%, 110%, 115%, or 120% of the size of the ideal beam profile. With the opening 166 having such a dimension, most of the beam similar to the ideal beam profile can pass through the opening 166 and can be measured at the Faraday cup 174 on the downstream side. A beam portion deviating from the ideal beam profile can be blocked by the electrode body 164, and the blocked portion can be quantitatively measured as a beam current intensity. Accordingly, the transfer state of the beam can be quantitatively evaluated in the middle of the multistage linear acceleration unit 110.

FIG. 4 illustrates envelopes B1, B2, and B3 of the ion beam B transferred inside the multistage linear acceleration unit 110. The transferred ion beam has a spread within a plane orthogonal to the beam trajectory Z (xy plane) and has a certain width (beam radius) in the x direction and the y direction. The beam profile is not constant in the xy plan view and is changed in accordance with the position thereof in the z direction along the beam trajectory Z. A beam envelope is acquired by continuously connecting a peripheral position of the beam that is changed in accordance with the position thereof in the z direction. The beam envelope has a tubular shape of which the widths in the x direction and the y direction are changed in accordance with the position thereof in the z direction. FIG. 4 illustrates the xz sectional shape of such a beam envelope.

Control parameters of the plurality of stages of lens electrodes of the multistage linear acceleration unit 110 are adjusted such that the transferred beam has the ideal beam profile. The envelope B3 illustrated by a solid line in FIG. 4 is an ideal envelope in which the transfer efficiency is maximized, and is an envelope in which the ideal beam profile is realized in the position of the electrode body 164. In a case where the ideal envelope is realized, the ion beam B that is incident into the multistage linear acceleration unit 110 is transferred without colliding with the high-frequency electrodes or lens electrodes. In the case of the envelope B1 illustrated by a dotted line or the envelope B2 illustrated by a broken line, a portion of the incident ion beam B collides with the high-frequency electrodes or lens electrodes and is lost. Thus, the transfer efficiency is decreased. In addition, the ion beam colliding with these electrodes sputters the electrodes, or causes dust to cling to the electrodes and scatters the clinging dust as a particle, thereby contaminating the beamline. Accordingly, the beam envelope should be appropriately controlled in the multistage linear acceleration unit 110 in order to realize a high quality ion implantation process.

In adjustment of the multistage linear acceleration unit 110, first, a control parameter (high-frequency parameter) of each stage of high-frequency resonators (high-frequency electrodes) is adjusted such that a desired beam energy is acquired. In the adjustment of the high-frequency parameter, the voltage amplitude, the frequency, and the phase of each stage of high-frequency resonators are adjusted. Next, a control parameter (lens parameter) of each stage of focusing lenses (lens electrodes) is adjusted such that the ideal beam envelope is acquired. The present embodiment uses a first current intensity and a second current intensity in combination when adjusting the lens parameter. The first current intensity is a measurement result of the first beam measuring unit 160. The second current intensity is a measurement result of the second beam measuring unit 170. Even in a case where the multistage linear acceleration unit 110 has many stages, the present embodiment realizes prompt and high accuracy parameter adjustment by using the measurement result of the first beam measuring unit 160 disposed in the middle of the multistage linear acceleration unit 110.

Figure 6:
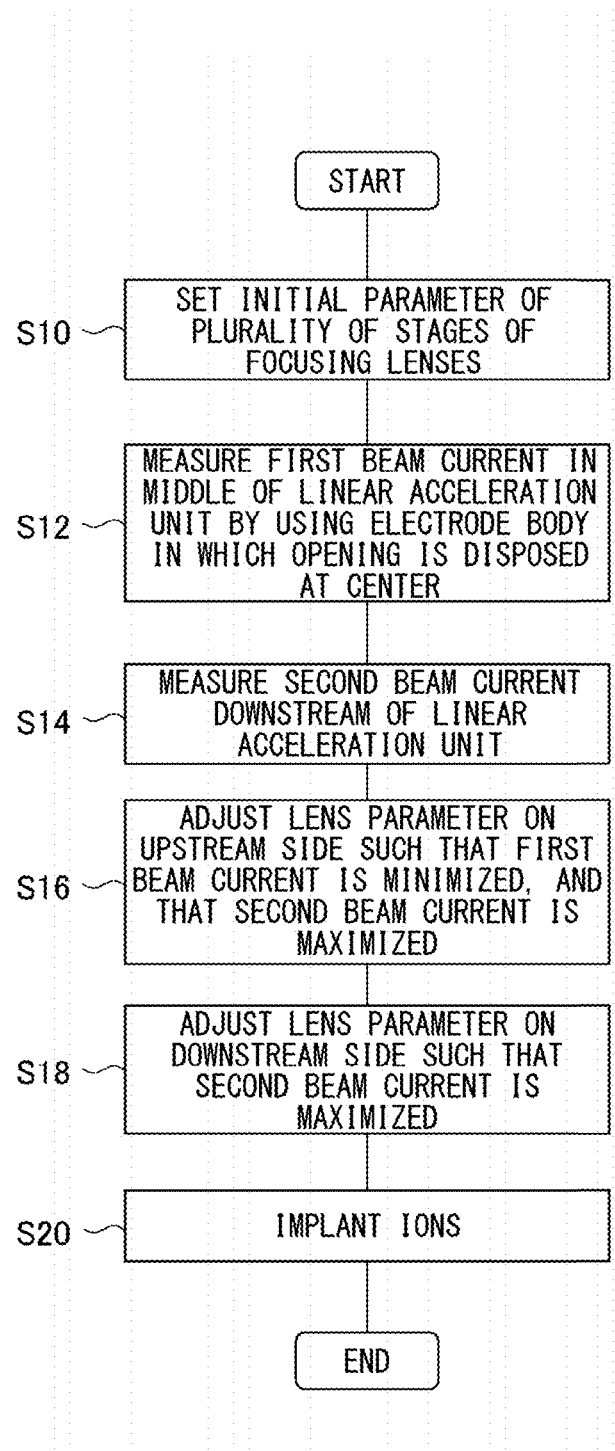
FIG. 6 is a flowchart illustrating an ion implantation method according to the embodiment.

FIG. 6 is a flowchart illustrating an ion implantation method according to the embodiment, and illustrates a method of adjusting the lens parameter. First, an initial parameter is set as the lens parameter of each focusing lens included in the first linear accelerator 111 and the second linear accelerator 112 (S10). The initial parameter may be a parameter stored in the storage device 70 included in the control unit 50, or may be a parameter calculated by optimization by the control operation device 54. Next, a first beam current (first current intensity) is measured by using the electrode body 164 that is disposed in the middle of the multistage linear acceleration unit 110 and has the opening 166 at the center thereof (S12). A second beam current (second current intensity) is measured by using the Faraday cup 174 disposed downstream of the multistage linear acceleration unit 110 (S14). The first beam current and the second beam current are measured at the same time. An entirety or a portion of the beam passing through the opening 166 of the electrode body 164 is measured by the Faraday cup 174 disposed downstream.

Next, the lens parameter is adjusted based on the measurement result of the beam current. The control unit 50 adjusts the lens parameter of the first linear accelerator 111 on the upstream side such that the first current intensity measured by the electrode body 164 is minimized, and that the second current intensity measured by the Faraday cup 174 is maximized (S16). In other words, the lens parameter of the first linear accelerator 111 is adjusted such that most of the beam exiting from the first linear accelerator 111 passes through the opening 166 of the electrode body 164. Next, the control unit 50 adjusts the lens parameter of the second linear accelerator 112 on the downstream side such that the second current intensity measured by the Faraday cup 174 is maximized (S18). After the adjustment of the lens parameter, the ion beam is transferred in accordance with the adjusted control parameter, and the ion implantation process is executed (S20).

Figure 7:
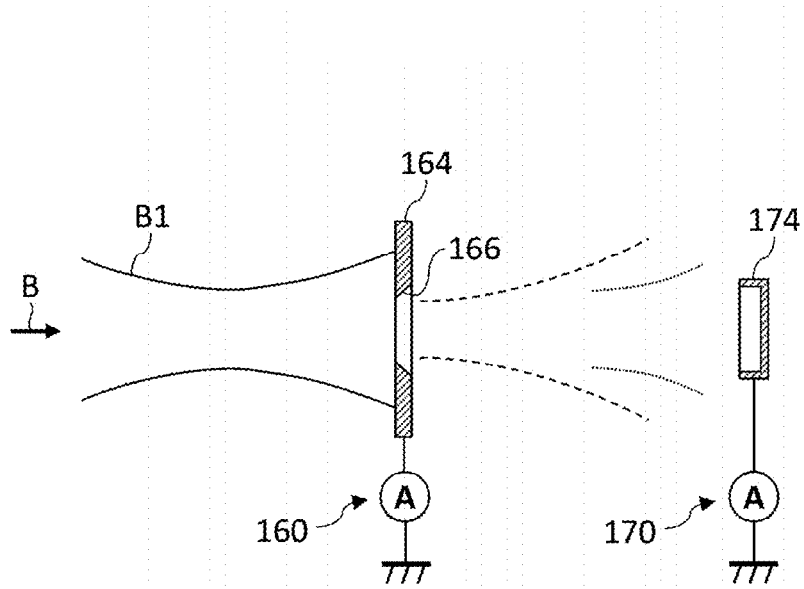
FIG. 7 is a diagram schematically illustrating an example of measurement of an ion beam based on an initial parameter.
Figure 8:
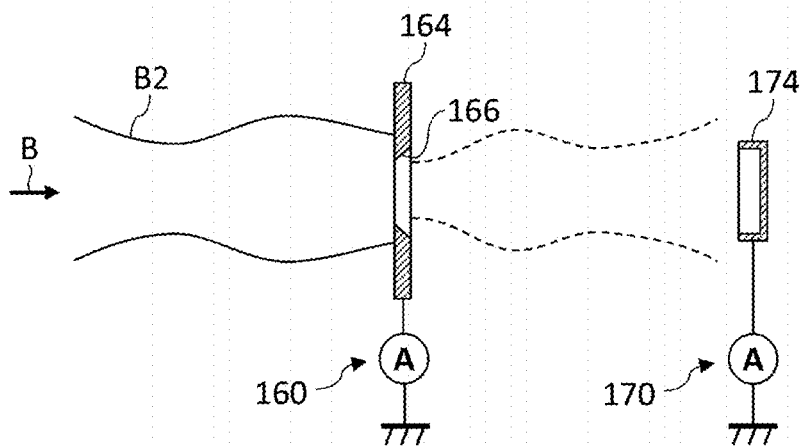
FIG. 8 is a diagram schematically illustrating an example of measurement of an ion beam in the middle of adjustment.
Figure 9:
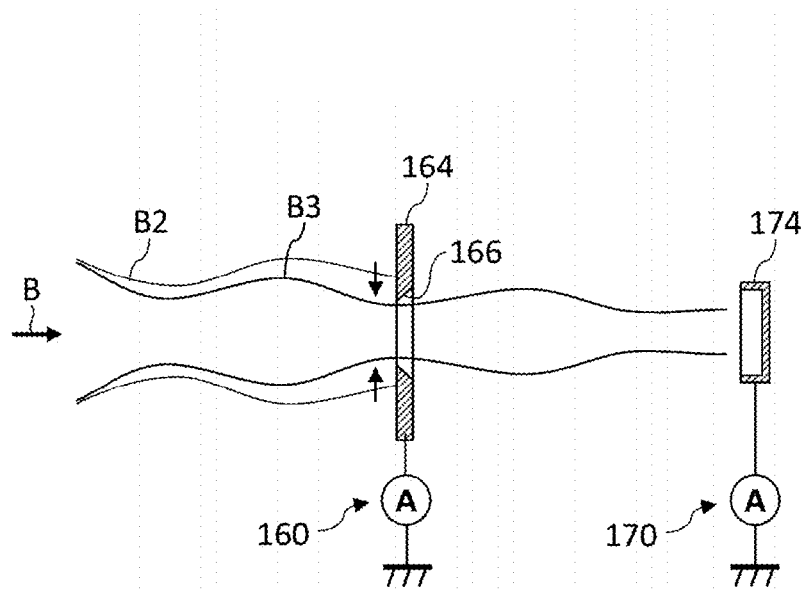
FIG. 9 is a diagram schematically illustrating an example of measurement of an ion beam after adjustment.

FIG. 7 to FIG. 9 schematically illustrate an example of measurement of the ion beam by the first beam measuring unit 160 and the second beam measuring unit 170, and schematically illustrate an adjustment process on the upstream side in S16. FIG. 7 schematically illustrates an example of measurement of the ion beam B based on the initial parameter, and illustrates the beam envelope B1 that is not optimized. In the example illustrated in FIG. 7, most of the ion beam B is blocked by the electrode body 164 since the beam radius in the position of the electrode body 164 is much greater than the dimension of the opening 166. Consequently, the first current intensity measured by the first beam measuring unit 160 has a comparatively large value. Since a small portion of the beam passes through the opening 166 of the electrode body 164, the second current intensity measured by the second beam measuring unit 170 has a comparatively small value.

FIG. 8 schematically illustrates an example of measurement of the ion beam B in the middle of adjustment, and illustrates the beam envelope B2 that is under optimization. In the example illustrated in FIG. 8, a proportion of the beam portion blocked by the electrode body 164 is decreased further than before adjustment since the beam radius in the position of the electrode body 164 is decreased further than in the case of FIG. 7. The second current intensity measured by the second beam measuring unit 170 is increased further than before adjustment since the proportion of the beam portion passing through the opening 166 of the electrode body 164 is increased further than before adjustment.

FIG. 9 schematically illustrates an example of measurement of the ion beam B after adjustment, and illustrates the beam envelope B3 that is optimized on the upstream side. In a case where the lens parameter is optimized, and the ideal beam envelope is realized, the entirety or most of the ion beam B passes through the opening 166 of the electrode body 164. Thus, the first current intensity measured by the first beam measuring unit 160 is significantly decreased. At the same time, the second current intensity measured by the second beam measuring unit 170 is maximized. Accordingly, by adjusting the lens parameter such that the first current intensity is minimized, and that the second current intensity is maximized, the ideal beam envelope illustrated in FIG. 9 can be acquired on the upstream side, and the beam transfer efficiency on the upstream side can be maximized.

Figure 10:
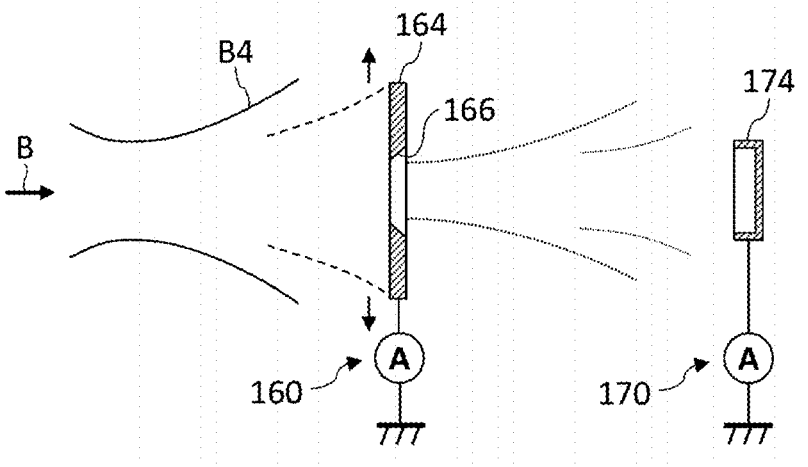
FIG. 10 is a diagram schematically illustrating another example of measurement of an ion beam in the middle of adjustment.

FIG. 10 illustrates another example of measurement of the ion beam B in the middle of adjustment, and illustrates a beam envelope B4 that is not appropriately adjusted on the upstream side. The example illustrated in FIG. 10 has a greater beam radius than the initial state illustrated in FIG. 7, and shows a state in which most of the beam does not reach the electrode body 164 and is lost. In this case, since the amount of the beam blocked by the electrode body 164 is decreased, the first current intensity measured by the first beam measuring unit 160 is decreased. In addition, since a small amount of the beam passes through the opening 166 of the electrode body 164, the second current intensity measured by the second beam measuring unit 170 also has a small value. Accordingly, in a case where the second current intensity is decreased even if the first current intensity is decreased, the adjustment is regarded as being inappropriate. Such a state needs to be restored to the state illustrated in FIG. 7 by adjusting the lens parameter such that both of the first current intensity and the second current intensity are increased. Then, adjustment can achieve the state illustrated in FIG. 8 or FIG. 9 by adjusting the lens parameter such that the first current intensity is decreased, and that the second current intensity is increased.

FIG. 11 is a table showing the current intensities that seem to be measured when adjusting the lens parameter. In the state before adjustment in FIG. 7, a first current intensity I1 is large, and a second current intensity I2 is small. Consequently, a current ratio I2/I1 of the second current intensity I2 to the first current intensity I1 is small. In the state during adjustment in FIG. 8, both of the first current intensity I1 and the second current intensity I2 have medium values. Thus, the current ratio I2/I1 also has a medium value. In the state after adjustment in FIG. 9, the first current intensity I1 is small, and the second current intensity I2 is large. Thus, the current ratio I2/I1 is also large. In the state of inappropriate adjustment in FIG. 10, both of the first current intensity I1 and the second current intensity I2 are small. Thus, the current ratio I2/I1 has a medium value. Accordingly, the beam envelope can also be optimized by adjusting the lens parameter such that both of the second current intensity I2 and the current ratio I2/I1 are increased. In a case where the lens parameter is adjusted such that the second current intensity I2 is decreased, and that the current ratio I2/I1 is increased, it is understood that parameter adjustment is made in an inappropriate direction. Accordingly, the lens parameter may be adjusted by using not only the first current intensity I1 and the second current intensity I2 but also the current ratio I2/I1 of the second current intensity I2 to the first current intensity I1 as an indicator.

In the ion implantation process of S20 in FIG. 6, the Faraday cup 174 of the second beam measuring unit 170 is placed into the retraction state. The electrode body 164 of the first beam measuring unit 160 remains in the insert position. Accordingly, the beam used in ion implantation is transferred with after passing through the opening 166 of the electrode body 164. By causing the electrode body 164 to remain inserted, the operating state of the multistage linear acceleration unit 110 can be monitored by using the first beam measuring unit 160. If the multistage linear acceleration unit 110 operates normally, the first current intensity detected by the first beam measuring unit 160 is small enough since the optimized beam envelope is maintained. However, in a case where the beam envelope is changed by deviation from the optimal condition due to a certain cause, it is considered that the first current intensity detected by the first beam measuring unit 160 is changed in accordance with the change in the beam envelope. For example, the beam radius in the position of the electrode body 164 may be increased, and the first current intensity may be increased. In a case where the amount of consequent change in the first current intensity departs from a predetermined allowed range, it may be determined that a fault occurs, and the ion implantation process may be interrupted.

According to the present embodiment, even in an accelerator having a large number of stages, the lens parameter can be promptly adjusted with high accuracy by using the electrode body 164 disposed in the middle of the multistage linear acceleration unit 110. In an adjustment method according to a comparative example using only a Faraday cup disposed downstream of a multistage linear acceleration unit, if the number of stages of an accelerator is increased in order to acquire a high energy, the number of stages of focusing lenses to be adjusted is increased, and a significant amount of time is taken in optimization. In a case where the parameter of each focusing lens positioned on the upstream side of the acceleration unit is inappropriately set, a beam having a sufficient current intensity may not reach the downstream side of the acceleration unit, or the current intensity of the beam may not be appropriately evaluated. In the present embodiment, the beam transfer state upstream of the electrode body 164 is detected with high accuracy by disposing the electrode body 164 in the middle of the accelerator having many stages. Thus, the lens parameter on the upstream side can be properly adjusted. Adjusting only the remaining lens parameter on the downstream side after adjusting the lens parameter on the upstream side can reduce the amount of time taken in adjustment further than in the case of optimizing the all lens parameter on both sides at the same time.

According to the present embodiment, the opening 166 is disposed at the center of the electrode body 164 on the upstream side. Thus, the beam current can be measured in the middle of the accelerator and at the exit of the accelerator at the same time. By enabling the both measurements at the same time, the electrode body 164 on the upstream side does not have to be retracted in order to measure the beam on the downstream side, and the amount of time taken in measurement and adjustment can be reduced. In addition, by causing the electrode body 164 to remain inserted during the ion implantation process, the ion implantation process can be executed while a state of the beam inside the multistage linear acceleration unit 110 is monitored.

The present invention is described heretofore based on the embodiment. The present invention is not limited to the embodiment and can have various design changes. Those skilled in the art may understand that various modified examples can be made, and that such modified examples fall within the scope of the present invention.

(Modified Example 1)

FIG. 12A and FIG. 12B are plan views schematically illustrating the structure of the electrode body 164 according to a modified example. In FIG. 12A, not only a center region A corresponding to the opening 166 at the center of the electrode body 164 is deficient, but also a part of the electrode body 164 outside the opening region A is deficient. In FIG. 12B, the electrode body 164 is configured with a plurality of electrode pieces 164a, 164b, 164c, and 164d. The plurality of electrode pieces 164a to 164d is disposed around the center region A. The electrode body 164 may have any shape, provided that the beam can pass through the vicinity of the center of the beam trajectory Z (center region A), and that the current intensity can be detected by blocking the beam in at least apart outside the center region A, as in the illustrated example.

(Modified Example 2)

Figure 13:
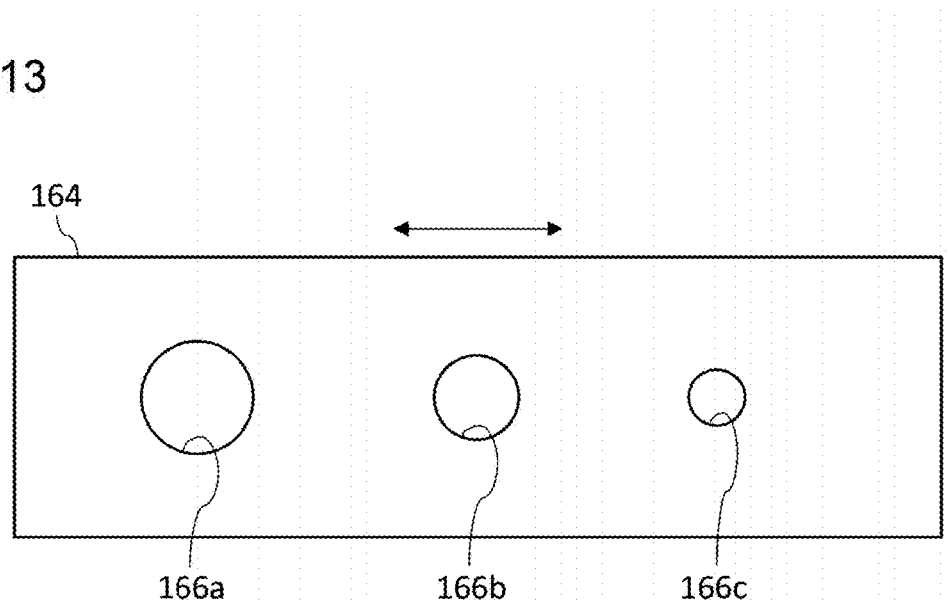
FIG. 13 is a plan view schematically illustrating a structure of an electrode body according to a modified example.

FIG. 13 is a plan view schematically illustrating the structure of the electrode body 164 according to another modified example. In FIG. 13, a plurality of openings 166a, 166b, and 166c are disposed in the single electrode body 164. The openings 166a to 166c are formed to have different opening dimensions. The electrode body 164 is configured to enable switching of the opening positioned at the center of the beam trajectory Z by changing the position of the electrode body 164. According to the present modified example, an opening having a size appropriate for adjustment of the lens parameter can be selected during adjustment. For example, an opening having a size appropriate for adjustment can be used in a case where the optimal beam envelope is different according to beam parameter such as the energy of the exiting ion beam. Accordingly, the accuracy of adjustment of the lens parameter can be further increased.

While the shapes of all openings are circular in the modified example illustrated in FIG. 13, the shapes of the plurality of openings disposed in the single electrode body may be changed in another modified n example. For example, an opening that is long in the horizontal direction (x direction), and an opening that is long in the vertical direction (y direction) may be disposed in a single electrode body. Accordingly, the plurality of openings disposed in the single electrode body may have difference in at least one of dimension and shape.

(Modified Example 3)

Figure 14:
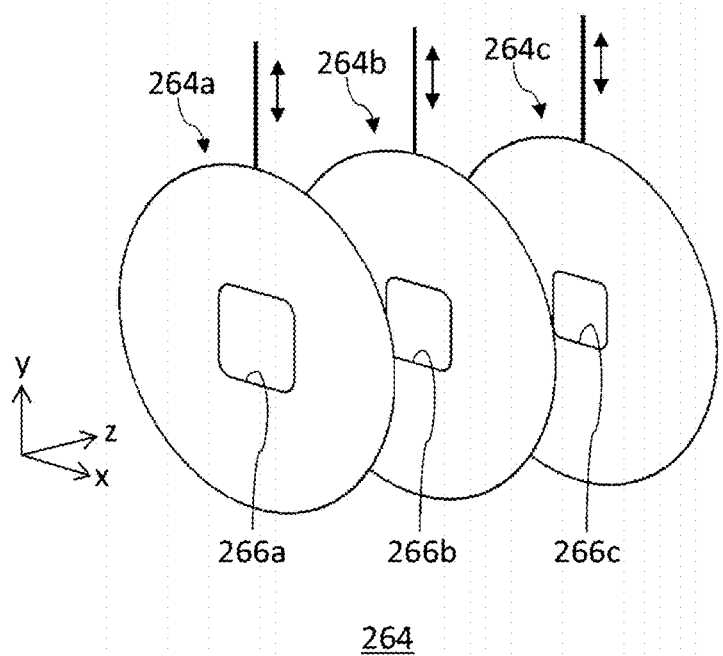
FIG. 14 is a perspective view schematically illustrating electrode structures according to a modified example.

FIG. 14 is a plan view schematically illustrating an electrode structure 264 according to a modified example. The electrode structure 264 is disposed instead of the electrode body 164 according to the embodiment. The electrode structure 264 has a plurality of electrode bodies 264a, 264b, and 264c. Openings 266a, 266b, and 266c are respectively disposed in the vicinity of the center of the electrode bodies 264a to 264c. The openings 266a to 266c of the electrode bodies 264a to 264c have different dimensions. In the illustrated example, the opening 266a of the electrode body 264a on the upstream side is the largest. The opening 266b of the electrode body 264b positioned in the middle is the second largest. The opening 266c of the electrode body 264c on the downstream side is the smallest. The openings 266a to 266c of the electrode bodies 264a to 264c may have different shapes. The electrode bodies 264a to 264c are linearly disposed along the beam trajectory Z and are independently configured to be capable of moving between the insert position and the retraction position. According to the present modified example, an opening having an appropriate shape and an appropriate dimension for adjustment of the lens parameter can be used by switching the electrode body inserted on the beam trajectory Z.

(Modified Example 4)

Figure 15:
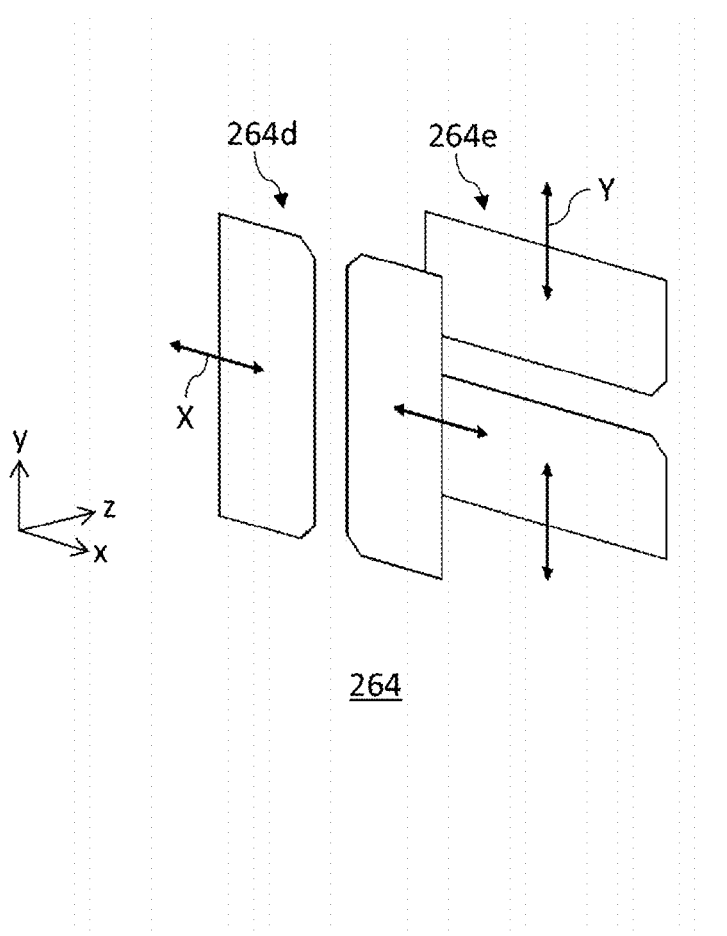
FIG. 15 is a perspective view schematically illustrating electrode structures according to a modified example.

FIG. 15 is a perspective view schematically illustrating the electrode structure 264 according to another modified example. In FIG. 15, a plurality of electrode bodies 264d and 264e are disposed along the beam trajectory Z. The first electrode body 264d forms a slit that is narrow in the horizontal direction (x direction) and long in the vertical direction (y direction). The slit width of the first electrode body 264d in the x direction is configured to be variable by displacing, in the horizontal direction (x direction), an electrode pair facing each other with the slit interposed. The second electrode body 264e forms a slit that is narrow in the y direction and long in the x direction. The slit width of the second electrode body 264e in the y direction is configured to be variable by displacing, in the y direction, an electrode pair facing each other with the slit interposed. The electrode structure 264 is configured such that at least one of the dimension in the x direction and the dimension in the y direction of the beam portion passing through the vicinity of the center of the beam trajectory Z is variable. According to the present modified example, the opening dimension of the electrode structure 264 can be changed optimally for adjustment of the lens parameter by changing the slit width of each of the first electrode body 264d and the second electrode body 264e. In another modified example, only one of the electrode bodies illustrated in FIG. 15 may be used, or the electrode bodies illustrated in FIG. 15 may be used in combination with the electrode body according to the embodiment or the other modified example.

(Modified Example 5)

The embodiment illustrates an example in which the first beam measuring unit 160 is disposed between the first linear accelerator 111 and the second linear accelerator 112. In a modified example, the first beam measuring unit 160 may be disposed in the middle of one continuous multistage linear acceleration unit. In this case, it is preferable that the first beam measuring unit 160 be disposed in a position corresponding to $1/3$ of the number of stages of the multistage linear acceleration unit. For example, if total 18 stages in an acceleration unit are provided, it is preferable that the first beam measuring unit 160 be disposed in the vicinity of the sixth stage from the upstream side. By disposing the first beam measuring unit 160 in the position corresponding to approximately $1/3$ of the number of stages, each adjustment on the upstream side and the downstream side of the first beam measuring unit 160 can be efficiently performed.

(Modified Example 6)

Figure 16:
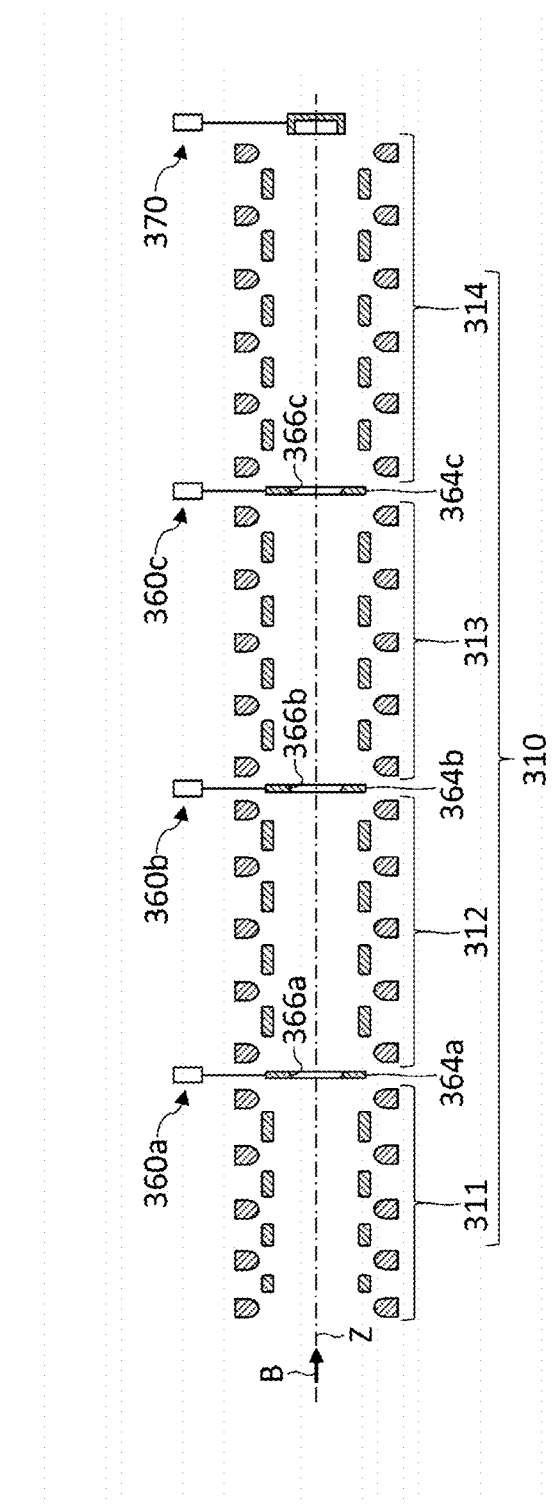
FIG. 16 is a sectional view illustrating a schematic configuration of a multistage linear acceleration unit according to a modified example.

FIG. 16 is a sectional view illustrating a schematic configuration of a multistage linear acceleration unit 310 according to a modified example. In the present modified example, a plurality of first beam measuring units 360a, 360b, and 360c are disposed in a plurality of positions corresponding to different stages of one multistage linear acceleration unit 310. A second beam measuring unit 370 is disposed downstream of the multistage linear acceleration unit 310. In the illustrated example, total 17 stages of high-frequency resonators are disposed, and the first beam measuring units 360a, 360b, and 360c are disposed respectively in three positions corresponding to the fourth stage, the eighth stage, and the twelfth stage.

In the illustrated example, the multistage linear acceleration unit 310 is divided into four units. A first unit 311 includes four stages of high-frequency resonators and five stages of lens electrodes. A second unit 312 includes four stages of high-frequency resonators and five stages of lens electrodes. A third unit 313 includes four stages of high-frequency resonators and five stages of lens electrodes. A fourth unit 314 includes five stages of high-frequency resonators and six stages of lens electrodes. The first beam measuring units 360a, 360b, and 360c are disposed in positions between each unit. Lens electrodes are disposed on the upstream side and the downstream side of each of the first beam measuring units 360a, 360b, and 360c.

In the present modified example, the lens parameter is adjusted in order from the upstream side as a group of each section divided by the positions in which the first beam measuring units 360a, 360b, and 360c are disposed. Specifically, the lens parameter of each of the first to fifth stages in the first unit 311 is initially adjusted. Next, the lens parameter of each of the sixth to tenth stages in the second unit 312 is adjusted. Next, the lens parameter of each of the eleventh to fifteenth stages in the third unit 313 is adjusted. Finally, the lens parameter of each of the sixteenth to twenty-first stages in the fourth unit 314 is adjusted.

A plurality of electrode bodies 364a, 364b, and 364c disposed in the plurality of positions corresponding to different stages may be configured to have difference in at least one of the shape and the dimension of the opening thereof. For example, the shapes and/or dimensions of the opening may be different from each other according to the ideal beam profile in the position in which each electrode body is disposed. Besides, the dimensions of openings 366a, 366b, and 366c in the plurality of electrode bodies 364a, 364b, and 364c may be gradually decreased from the upstream side toward the downstream side. By decreasing the opening dimensions toward the downstream side, the dimension of the beam envelope can be estimated from the current intensity detected at each electrode body.

(Modified Example 7)

The embodiment illustrates the case of executing the ion implantation process with the electrode body 164 disposed in the insert position. In another modified example, the ion implantation process may be executed with the electrode body 164 disposed in the retraction position. By causing the electrode body 164 to retract, the beam can be prevented from being blocked by the electrode body 164, and the current intensity of the exiting beam can be increased.

(Modified Example 8)

The embodiment and the modified examples illustrate a case where the multistage linear acceleration unit includes an electric field quadrupole lens. In another modified example, a magnetic field quadrupole lens may be used.

It should be understood that the invention is not limited to the above-described embodiment, but may be modified into various forms on the basis of the spirit of the invention. Additionally, the modifications are included in the scope of the invention.

What is claimed is:

1. An ion implantation apparatus comprising:
   a multistage linear acceleration unit that includes a plurality of stages of high-frequency resonators disposed along a beam trajectory in design and configured to accelerate an ion beam transferred along the beam trajectory, and a plurality of stages of focusing lenses, each of which is disposed between each of the stages of the high-frequency resonators and is configured to cause the ion beam to converge in at least one of an x direction and a y direction orthogonal with respect to the beam trajectory to adjust a beam profile of the transferred ion beam in a plan view orthogonal with respect to the beam trajectory;
   a first beam measuring unit that is disposed in the middle of the multistage linear acceleration unit, includes an electrode body disposed away from at least a vicinity of a center of the beam trajectory in the plan view orthogonal with respect to the beam trajectory, and is configured to allow passage of a beam portion adjacent to the center of the beam trajectory and measure a current intensity of another beam portion blocked by the electrode body outside the vicinity of the center of the beam trajectory;
   a second beam measuring unit that is disposed downstream of the multistage linear acceleration unit and is configured to measure a current intensity of the ion beam exiting from the multistage linear acceleration unit; and a control device configured to adjust a control parameter of the plurality of stages of focusing lenses based on measurement results of the first beam measuring unit and the second beam measuring unit such that the current intensity of the beam exiting from the multistage linear acceleration unit is equivalent to a target value.

2. The ion implantation apparatus according to claim 1, wherein the control device adjusts the control parameter of the plurality of stages of focusing lenses such that the current intensity measured by the first beam measuring unit is reduced, and that the current intensity measured by the second beam measuring unit is increased.

3. The ion implantation apparatus according to claim 2, wherein the control device adjusts the control parameter of the focusing lens on an upstream side of the electrode body such that the current intensity measured by the first beam measuring unit is reduced, and that the current intensity measured by the second beam measuring unit is increased.

4. The ion implantation apparatus according to claim 3, wherein the control device, after adjusting the control parameter of the focusing lens on the upstream side of the electrode body such that the current intensity measured by the first beam measuring unit is increased, adjusts the control parameter of the focusing lens on the upstream side of the electrode body such that the current intensity measured by the first beam measuring unit is reduced, and that the current intensity measured by the second beam measuring unit is increased.

5. The ion implantation apparatus according to claim 1, wherein the control device, after adjusting the control parameter of the focusing lens on an upstream side of the electrode body, adjusts the control parameter of the focusing lens on a downstream side of the electrode body such that the current intensity measured by the second beam measuring unit is increased.

6. The ion implantation apparatus according to claim 1, wherein the control device adjusts the control parameter of the plurality of stages of focusing lenses based on a ratio of a second current intensity to a first current intensity, the first current intensity being a measurement result of the first beam measuring unit, the second current intensity being a measurement result of the second beam measuring unit, and the first current intensity and the second current intensity being measured at the same time by the first beam measuring unit and the second beam measuring unit.

7. The ion implantation apparatus according to claim 1, wherein the electrode body includes an opening through which the beam portion adjacent to the center of the beam trajectory passes.

8. The ion implantation apparatus according to claim 7, wherein the opening of the electrode body has a circular shape, an elliptical shape, or a rectangular shape.

9. The ion implantation apparatus according to claim 7, wherein a dimension in the x direction of the opening of the electrode body is different from a dimension in the y direction of the opening of the electrode body.

10. The ion implantation apparatus according to claim 7, wherein the control device adjusts the control parameter of the plurality of stages of focusing lenses such that the ion beam transferred inside the multistage linear acceleration unit has an ideal beam profile in design in the plan view orthogonal with respect to the beam trajectory, and the opening of the electrode body has a shape that corresponds to the ideal beam profile in a position of the electrode body.

11. The ion implantation apparatus according to claim 10, wherein the opening of the electrode body has the same dimension as the ideal beam profile in the position of the electrode body or a smaller dimension than the ideal beam profile in the position of the electrode body.

12. The ion implantation apparatus according to claim 10, wherein the position of the electrode body in a direction along the beam trajectory is a position where the ideal beam profile has the minimum dimension.

13. The ion implantation apparatus according to claim 8, wherein the first beam measuring unit includes a single electrode body including a plurality of openings having different opening dimensions or includes a plurality of electrode bodies each including an opening having a different opening dimension, and the first beam measuring unit is configured to enable switching of the opening dimension of the opening positioned in the vicinity of the center of the beam trajectory.

14. The ion implantation apparatus according to claim 1, wherein the electrode body is configured such that at least one of a dimension in the x direction and a dimension in the y direction of the beam portion passing through the vicinity of the center of the beam trajectory is variable.

15. The ion implantation apparatus according to claim 1, wherein the electrode body is configured to be movable between a state in which the electrode body is disposed in an insert position where the electrode body allows passage of the beam portion adjacent to the center of the beam trajectory and blocks the other beam portion outside the vicinity of the center of the beam trajectory, and a state in which the electrode body is disposed in a receding position where the electrode body does not block the transferred ion beam.

16. The ion implantation apparatus according to claim 15, wherein the control device adjusts the control parameter of the plurality of stages of focusing lenses in the state in which the electrode body is disposed in the insert position, and executes anion implantation process on a wafer in the state in which the electrode body is disposed in the receding position.

17. The ion implantation apparatus according to claim 15, wherein the control device executes an ion implantation process on a wafer in the state in which the electrode body is disposed in the insert position, and monitors the ion beam with which the wafer is irradiated, based on the measurement result of the first beam measuring unit.

18. The ion implantation apparatus according to claim 1, wherein the multistage linear acceleration unit includes a first linear accelerator including a plurality of stages of high-frequency resonators, and a second linear accelerator including a plurality of stages of high-frequency resonators and disposed downstream of the first linear accelerator, and the electrode body is disposed in a position between the first linear accelerator and the second linear accelerator.

19. The ion implantation apparatus according to claim 18, wherein the number of stages of high-frequency resonators included in the second linear accelerator is greater than the number of stages of high-frequency resonators included in the first linear accelerator.

20. The ion implantation apparatus according to claim 1, wherein the first beam measuring unit includes a plurality of electrode bodies respectively disposed in positions corresponding to different stages of the plurality of stages of high-frequency resonators, each of the plurality of electrode bodies is disposed away from at least the vicinity of the center of the beam trajectory in the plan view orthogonal with respect to the beam trajectory, and the first beam measuring unit is configured to allow passage of the beam portion adjacent to the center of the beam trajectory and measure the current intensity of each of other beam portions blocked outside the vicinity of the center of the beam trajectory, and the control device adjusts the control parameter of the plurality of stages of focusing lenses based on the current intensity measured by each of the plurality of electrode bodies.

21. The ion implantation apparatus according to claim 20, wherein each of the plurality of electrode bodies has an opening through which the beam portion adjacent to the center of the beam trajectory passes, and an opening dimension of the electrode body disposed on a downstream side is smaller than an opening dimension of the electrode body disposed on an upstream side.

22. An ion implantation method using an ion implantation apparatus including a multistage linear acceleration unit that includes a plurality of stages of high-frequency resonators disposed along a beam trajectory in design and configured to accelerate an ion beam transferred along the beam trajectory, and a plurality of stages of focusing lenses, each of which is disposed between each stage of the high-frequency resonators and is configured to cause the ion beam to converge in at least one of an x direction and a y direction orthogonal with respect to the beam trajectory to adjust a beam profile of the transferred ion beam in a plan view orthogonal with respect to the beam trajectory, a first beam measuring unit that is disposed in the middle of the multistage linear acceleration unit, includes an electrode body disposed away from at least a vicinity of a center of the beam trajectory in the plan view orthogonal with respect to the beam trajectory, and is configured to allow passage of a beam portion adjacent to the center of the beam trajectory and measure a current intensity of another beam portion blocked by the electrode body outside the vicinity of the center of the beam trajectory, a second beam measuring unit that is disposed downstream of the multistage linear acceleration unit and is configured to measure a current intensity of the ion beam exiting from the multistage linear acceleration unit, and a control device configured to adjust a control parameter of the plurality of stages of focusing lenses based on measurement results of the first beam measuring unit and the second beam measuring unit such that the current intensity of the beam exiting from the multistage linear acceleration unit is equivalent to a target value, the method comprising:

adjusting the control parameter of the plurality of stages of focusing lenses such that the current intensity measured by the first beam measuring unit is reduced, and that the current intensity measured by the second beam measuring unit is increased; and implanting ions into a wafer by using the ion beam exiting from the multistage linear acceleration unit that operates based on the adjusted control parameter.

* * * * *